United States Patent [19]
Kerber et al.

[11] Patent Number: 5,623,155
[45] Date of Patent: Apr. 22, 1997

[54] MOSFET ON SOI SUBSTRATE

[75] Inventors: Martin Kerber; Reinhard Mahnkopf, both of Munich, Germany

[73] Assignee: Siemens Aktiengesellschaft, Munich, Germany

[21] Appl. No.: 559,485

[22] Filed: Nov. 15, 1995

[30] Foreign Application Priority Data

Nov. 24, 1994 [DE] Germany ............................ 44 41 901.5

[51] Int. Cl.[6] ............................. H01L 27/01; H01L 27/12
[52] U.S. Cl. ............................................. 257/347; 257/350
[58] Field of Search ................................... 257/347, 348, 257/349, 350, 351, 352, 353, 354

[56] References Cited

U.S. PATENT DOCUMENTS

| | | | |
|---|---|---|---|
| 5,293,052 | 3/1994 | Cherne et al. | 257/349 |
| 5,446,301 | 8/1995 | Eguchi et al. | 257/354 |

FOREIGN PATENT DOCUMENTS

| | | |
|---|---|---|
| 0294868 | 12/1988 | European Pat. Off. . |
| 0370809 | 5/1990 | European Pat. Off. . |
| WO93/08603 | 4/1993 | WIPO . |

OTHER PUBLICATIONS

Elimination of Bipolar-Induced Breakdown in Fully-Depleted SOI MOSFETs-Eric P. Ver Ploeg et al. 1992 IEEE IEDM 92-337-340.

Primary Examiner—Carl Whitehead, Jr.
Attorney, Agent, or Firm—Hill, Steadman & Simpson

[57] ABSTRACT

A MOSFET is provided in the body silicon layer of an SOI substrate, for example as a mesa. A source region, a channel region, and a drain region are present. A gate electrode having a portion as a ridge on this channel region is also provided. For electrical connection of the channel region, a highly doped, preferably laterally arranged channel terminal region that is electrically conductively connected to the channel region and that has a contact applied thereon.

6 Claims, 1 Drawing Sheet

MOSFET ON SOI SUBSTRATE

BACKGROUND OF THE INVENTION

The present invention is directed to a MOSFET on a SOI substrate.

In MOSFETs on extremely thin surface layers such as, for example, given employment of SOI substrates with an extremely thin useful layer of silicon (what is referred to as a silicon body layer) for the manufacture of fully depleted MOSFETs, the cutoff voltage is highly dependent on the thickness of the silicon body, this being very difficult to technologically govern. Although the cutoff voltage is kept within narrow limits given employment of thicker layers, the kink effect occurs, this producing a shift of the substrate potential due to substrate current that does not flow off, given an increasing, applied voltage and that can only be avoided by a terminal contact at the silicon body layer via which the substrate current can then be diverted. Fully depleted and partially depleted MOSFETs on an SOI substrate have been realized with a body terminal (for example, E. P. Ver Ploeg et al. in IEDM 92, 337 through 340 (1992)). The recited solutions, however, are usually not compatible without further ado with the overall process and require additional technological techniques, or lead to an asymmetry of the MOSFETs that is disadvantageous for circuit applications.

SUMMARY OF THE INVENTION

An object of the present invention is to specify an improved MOSFET on an SOI substrate, particularly in view of the cutoff voltage and the effects of the substrate potential, and to specify a corresponding manufacturing method.

According to the invention, a MOSFET is provided on an SOI substrate comprising a silicon body layer on an insulator layer. A doped source region, a doped drain region, and a channel region therebetween doped for opposite conductivity type are provided in the silicon body layer. A gate electrode is present formed of a straight-line ridge that proceeds over the channel region and which is connected to a gate terminal region. The ridge is electrically insulated from the channel region by a dielectric layer. A highly doped channel terminal region electrically conductively connected to the channel region is provided which directly adjoins neither the source region nor the drain region. The source region, the drain region, the gate terminal region, and the channel terminal region are each respectively provided with a contact.

In addition to the regions for source, channel and drain, a further region that is preferably arranged laterally thereto, and which is adequately highly doped for electrical connection, is present in the MOSFET of the invention. This further region is electrically conductively connected to the channel region and is doped for the same conductivity type, so that a further potential can be applied directly to the channel region via the corresponding terminal contact. These doped regions belonging to the MOSFET are produced in the silicon body of an SOI substrate, for example in the form of a mesa, or with a surrounding LOCOS insulation. The gate electrode is fundamentally applied in the way which is standard in MOSFETs. The gate electrode is conducted in ridge-shaped fashion over the channel region. One end of this ridge does not project beyond, or only slightly projects beyond, the channel region. Undesirable, additional capacitances between the gate electrode and the source and drain regions are thus kept optimally small. The other end of the ridge is widened to the standard gate terminal region. Implantations of dopant are undertaken such that the highly doped terminal region for the channel region is separated from the source and drain regions doped opposite thereto by at least a narrow part of the lightly doped channel region. A description of the MOSFET of the invention follows with reference to FIGS. 1 and 2.

DESCRIPTION OF THE PREFERRED EMBODIMENTS

Figure 1:
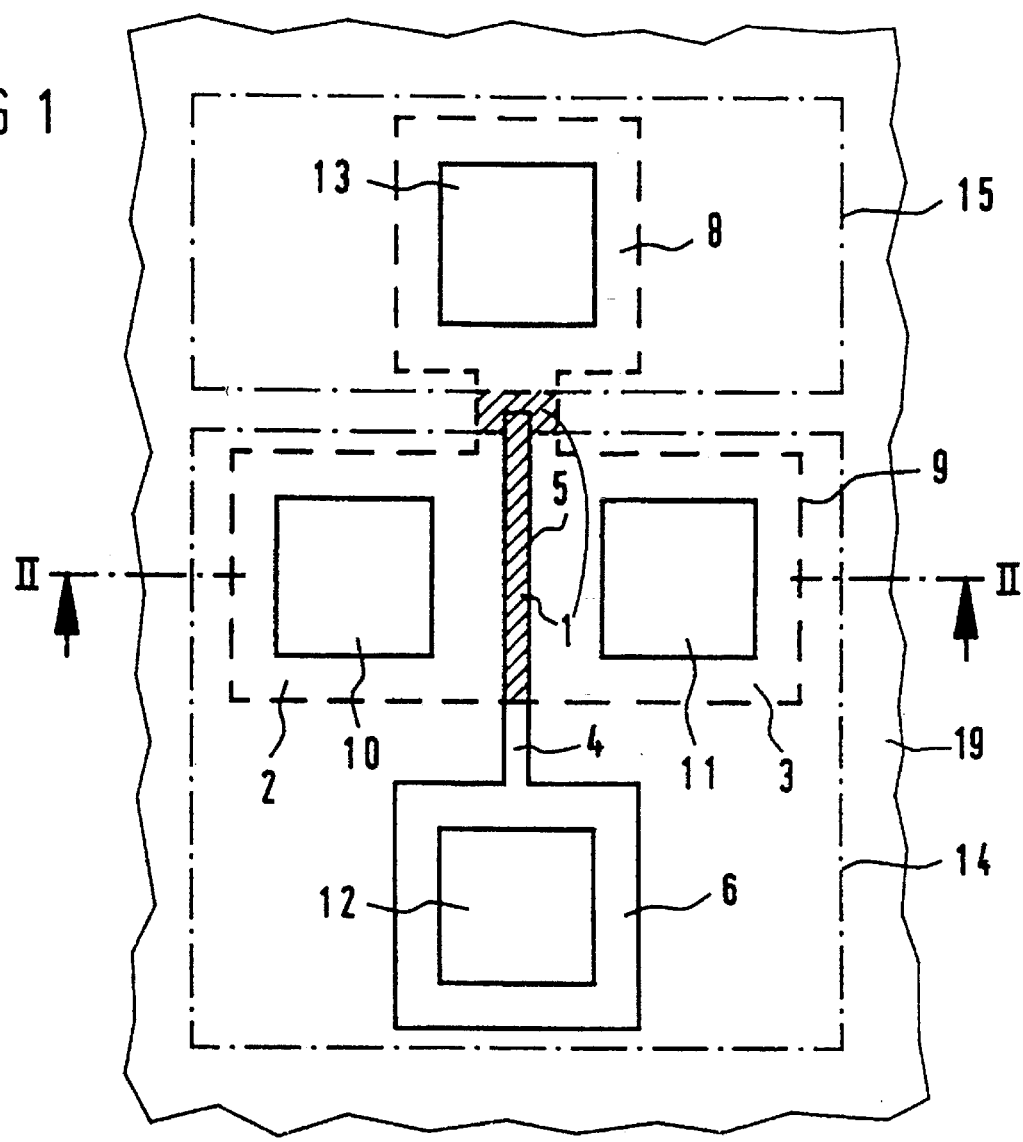
FIG. 1 shows a MOSFET of the invention in plan view.

The MOSFET of the invention is most easily described on the basis of the manufacturing method. A region that is electrically insulated all around and that is provided for the MOSFET is produced in a silicon body layer of an SOI substrate as a mesa 9 (broken-line boundary in FIG. 1) manufactured in this silicon body layer, or the corresponding region is electrically insulated all around by a LOCOS insulation. In the exemplary embodiment shown in FIG. 1, the silicon of the silicon body layer is completely removed to form the mesa 9 (shown with broken lines as a covered contour) down to the oxide insulator layer 17 (see FIG. 2) located therebelow. A basic doping for the channel region 1, which is shown in shaded fashion, is introduced into this region of the mesa 9. As is standard in MOSFETs, the gate electrode 4 can be applied onto a dielectric layer produced at the surface of the mesa 9, for example by oxidation, and can be structured.

In the MOSFET of the invention, the gate electrode 4 is formed by a ridge 5 over the channel region 1, and a gate terminal region 6 is connected thereto. Given employment of a mesa 9, this terminal region 6 is applied directly onto the insulator layer 17 of the SOI silicon substrate bulk layer 18. In terms of its lateral dimensions, the ridge 5 of the gate electrode should coincide insofar as possible with that part of the channel region 1 located between the source region 2 and the drain region 3. That end of the ridge 5 lying opposite the terminal region 6 should project no further beyond this part of the channel region 1 located between source and drain than is absolutely necessary due to the manufacturing process. A short section of the ridge 5 as a connection to the terminal region 6 is found only at the other side.

An implantation provided for the source and drain as well as for the gate electrode occurs upon employment of a mask in the region 14 bounded with dot-dash lines. An implantation of an opposite operational sign occurs in the region 15 bounded with dot-dash lines using a further mask. Regions 14 and 15 are not shown in FIG. 2, since they designate the respective openings of the masks. These masks removed after the implantations are not part of the device. Thus, they are not shown in FIG. 2. Implantations of both operational signs are necessary anyway, given complementary MOSFETs usually manufactured simultaneously, so that the implantations required for the MOSFET of the invention can occur efficiently within the framework of the CMOS manufacturing process on the basis of the suitable selection of the mask openings. A direct adjacency of this channel terminal region 8 at the source region 2 or the drain region 3 is avoided, so that the functioning of the MOSFET is not deteriorated due to the highly doped channel terminal region 8. In the described exemplary embodiment of FIG. 1, this is accomplished in that a narrow part of the channel region 1 is still present between the channel terminal region 8 and the source region 2 or the drain region 3. Since the channel region 1 comprises the relatively light basic doping, this prevents the highly doped terminal regions of different operational signs from directly adjoining one another. Fundamentally, the connection between the channel terminal region 8 and that part of the channel region 1 located between the source and the drain can also be limited to the width of this channel region 1. The manufacture is simplified, however, when the doped region between the source, the drain and the channel terminal region 8 is somewhat broader. What is achieved by the spacing of the regions that are occupied by the openings of the masks in the implantations is that the narrow, lightly doped portion of the channel region proceeding in the longitudinal direction of the source, channel and the drain, i.e. transversely relative to the longitudinal direction of the ridge, remains between the channel terminal region 8 and the source and the drain regions 2,3.

The source, drain, gate terminal, and channel terminal regions 2, 3, 6, and 8 are provided with respective source drain, gate terminal, and channel terminal contacts 10, 11, 12 and 13.

Figure 2:
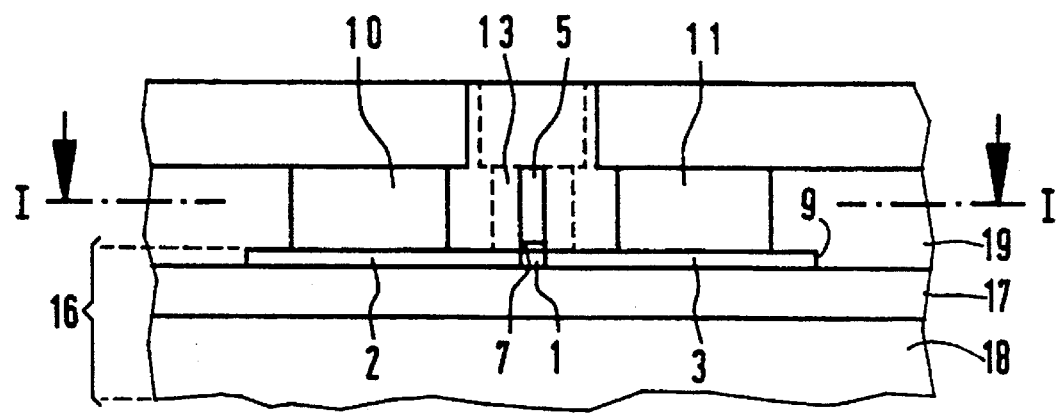
FIG. 2 shows the MOSFET of FIG. 1 in section II—II shown in FIG. 1.

FIG. 2 shows the crossection shown in FIG. 1. In FIG. 2, an isolation dielectric layer 19 is shown surrounding the mesa 9. The mesa 9 lies on an insulator oxide layer 17, which in turn lies on a silicon bulk layer 18. The mesa 9, insulator layer 17, and silicon bulk layer 18 all form the SOI substrate 16 shown by a bracket in FIG. 2. The dielectric layer 7 functioning as a gate oxide is shown between the channel region 1 and the ridge 5 of the gate electrode, this layer 7 having been etched back to the width of the ridge 5 in this exemplary embodiment for the sake of simplicity. However, it suffices when the dielectric layer is removed only in the regions where the contacts 10,11,13 are applied. As a covered contour, the contact 13 applied on the channel terminal region 8 is shown with broken lines in FIG. 2 (Contact 13 is not drawn to scale, and is shown smaller in FIG. 2). A first metallization level for the connection or for the further wiring of the contacts is also schematically indicated. The MOSFET, for example, is covered by a dielectric layer and is planarized. The described MOSFET structure is fully compatible with the CMOS process on the SOI substrate. It can therefore be realized in a simple way, together with previously known MOSFETs and other components within the framework of the overall process.

Although various minor changes and modifications might be proposed by those skilled in the art, it will be understood that our wish is to include within the claims of the patent warranted hereon all such changes and modifications as reasonably come within our contribution to the art.

We claim as our invention:

1. A MOSFET, comprising:

an SOI substrate comprising a silicon body layer on an insulator layer;

said silicon body layer having a doped source region, a doped drain region, and a channel region between the source and drain regions and doped for a conductivity type which is opposite a conductivity type of the doped source and drain regions;

a gate electrode formed of a straight-line ridge preceding over said channel region, said gate electrode electrically connecting to a gate terminal region;

said ridge being electrically insulated from said channel region by a dielectric layer;

a highly doped channel terminal region electrically conductively connected to the channel region and which is laterally spaced away from said source region and said drain region; and said source region, said drain region, said gate terminal region, and said channel terminal region each being provided with a respective contact.

2. A MOSFET according to claim 1 wherein said silicon body layer forms a mesa.

3. A MOSFET according to claim 1 wherein said source region, said drain region, said channel region, and said channel terminal region are surrounded by a dielectric insulation.

4. A MOSFET according to claim 1 wherein said gate electrode comprises polysilicon.

5. A MOSFET according to claim 1 wherein said ridge, except for a portion required for an electrically conductive connection to said gate terminal region, is present only over said channel region.

6. A MOSFET according to claim 1 wherein the highly doped channel terminal region is spaced from and in line with a longitudinal direction of said ridge and has a doping which is of an opposite conductivity type as compared to a doping of said source and drain regions.

* * * * *